(12) United States Patent
Goode et al.

(10) Patent No.: US 11,869,614 B2
(45) Date of Patent: Jan. 9, 2024

(54) CELL STATISTICS GENERATOR FOR NVM DEVICES

(71) Applicant: Western Digital Technologies, Inc., San Jose, CA (US)

(72) Inventors: Jonas Goode, Lake Forest, CA (US); Richard Galbraith, Rochester, MN (US); Henry Yip, Bellflower, CA (US); Vinh Hoang, Laguna Hills, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 126 days.

(21) Appl. No.: 17/412,161

(22) Filed: Aug. 25, 2021

(65) Prior Publication Data

US 2023/0063666 A1    Mar. 2, 2023

(51) Int. Cl.
*G11C 29/12* (2006.01)
*G11C 7/06* (2006.01)
*G11C 16/34* (2006.01)
*G11C 29/50* (2006.01)

(52) U.S. Cl.
CPC .......... *G11C 29/12005* (2013.01); *G11C 7/06* (2013.01); *G11C 16/3431* (2013.01); *G11C 29/50004* (2013.01)

(58) Field of Classification Search
CPC . G11C 29/12005; G11C 7/06; G11C 16/3431; G11C 29/50004
USPC ......................................................... 714/721
See application file for complete search history.

(56) References Cited

U.S. PATENT DOCUMENTS

| | | |
|---|---|---|
| 8,000,135 B1 | 8/2011 | Perlmutter et al. |
| 8,923,062 B1 | 12/2014 | Lee et al. |
| 9,269,448 B2 | 2/2016 | Tang et al. |
| 9,484,098 B1 | 11/2016 | Hsu et al. |
| 9,741,431 B2 | 8/2017 | Kumar et al. |
| 9,842,023 B2 | 12/2017 | Tang et al. |
| 10,236,070 B2 | 3/2019 | Barndt et al. |
| 10,347,331 B2 | 7/2019 | Zhang et al. |
| 11,119,848 B2 * | 9/2021 | Liikanen ............. G06F 11/1048 |
| 2016/0148702 A1 | 5/2016 | Karakulak et al. |
| 2016/0357631 A1 | 12/2016 | Cohen |

(Continued)

OTHER PUBLICATIONS

Berahas et al. "A theoretical and empirical comparison of gradient approximations in derivative-free optimization," arXiv preprint arXiv:1905.01332, Dec. 31, 2019, pp. 3-4, 12.

(Continued)

*Primary Examiner* — James C Kerveros
(74) *Attorney, Agent, or Firm* — PATTERSON + SHERIDAN, LLP; Steven H. VerSteeg

(57) ABSTRACT

A non-volatile memory device includes a plurality of wordlines, each comprising a plurality of cells, a hard decode configured to read each cell of the plurality of cells at a hard decode voltage, a left read sense configured to read voltage values of each cell to the left of the hard decode voltage at a left read sense voltage, a right read sense configured to read voltage values of each cell to the right of the hard decode voltage at a right read sense voltage, a first combiner configured to determine a difference of voltage values read by the left read sense and right read sense to produce a dispersion signal, and a second combiner configured to determine a sum of the voltage values read by the left read sense and right read sense to produce a deviation signal.

19 Claims, 8 Drawing Sheets

(56) References Cited

U.S. PATENT DOCUMENTS

2018/0350441 A1* 12/2018 Kim .................. G06F 11/1012
2019/0102084 A1   4/2019 Zhang et al.
2019/0354313 A1   11/2019 Sheperek et al.
2019/0391865 A1   12/2019 Cadloni et al.
2020/0105353 A1   4/2020 Sharon et al.
2021/0011801 A1*  1/2021 Liikanen ............ G06F 11/1048

OTHER PUBLICATIONS

International Search Report and the Written Opinion for International Application No. PCT/US2020/066898, dated Mar. 3, 2021, 17 pages.
Kelley, C.T. "Iterative methods for optimization," Society for Industrial and Applied Mathematics, 1999, Dec. 31, 1999, pp. 17, 39-52.
Pulkkinen, S. "A Review of Methods for Unconstrained Optimization: Theory, Implementation and Testing," 2008, available at <https://core.ac.uk/download/pdf/14916847.pdf>, Dec. 31, 2008, Chapter 2.3. Gradient Descent Methods, pp. 13-36; Appendix A.5 Finite-Difference, Approximations, pp. 98-99.
Wikipedia Contributors, (Jun. 18, 2020). Finite difference. In Wikipedia, The Free Encyclopedia. Retrieved 13:49, Mar. 1, 2021, from URL <https://en.wikipedia.org/w/index.php?title=Finite_difference&oldid=963179578>, Jun. 18, 2020 (Jun. 18, 2020), Ch. "Relation with derivatives".

* cited by examiner

CELL STATISTICS GENERATOR FOR NVM DEVICES

BACKGROUND OF THE DISCLOSURE

Field of the Disclosure

Embodiments of the present disclosure generally relate to error detection in a non-volatile memory (NVM) device, and more particularly, to setting voltage read levels in an NVM device.

Description of the Related Art

When reading data from a non-volatile memory (NVM) device such as a NAND, NOR, XOR, or other type of NVM device, voltages from cells on a wordline are read at a programmed hard decode voltage level. However, errors in cell voltage levels may be introduced by variances in device temperature, vibration, and/or wear, in addition to errors that may have been introduced during manufacturing, in addition to retention and program erase cycle degradation during use.

When a hard decode read is determined to be in error, one or more soft decode read voltage levels, typically placed about the hard decode voltage are used in error correction. Conventionally, soft decode voltage levels may be statically placed, using predetermined values that may not be responsive to conditions that cause errors to be generated outside of the predetermined voltages. In response, some data storage devices implement a 'valley search' method to provide adjustment to soft decode voltage levels, however valley search that seeks to optimize hard decode read level positions, by finding the bottom of a shallow bit error rate (BER) valley. However, valley search may find incorrect local values for adjustment of hard decode voltages as it is susceptible to noise and unsymmetrical cell distributions, resulting in little to no performance improvement in detection or correction of errors.

What is needed are systems and methods to mitigate issues of prior approaches.

SUMMARY OF THE DISCLOSURE

The present disclosure generally relates to error detection in a non-volatile memory (NVM) device, and more particularly, to setting voltage read levels in an NVM device. A non-volatile memory device includes a plurality of wordlines, each comprising a plurality of cells, a hard decode configured to read each cell of the plurality of cells at a hard decode voltage, a left read sense configured to read voltage values of each cell to the left of the hard decode voltage at a left read sense voltage, a right read sense configured to read voltage values of each cell to the right of the hard decode voltage at a right read sense voltage, a first combiner configured to determine a difference of voltage values read by the left read sense and right read sense to produce a dispersion signal, and a second combiner configured to determine a sum of the voltage values read by the left read sense and right read sense to produce a deviation signal.

In one embodiment, a non-volatile memory (NVM) device includes a plurality of wordlines, each comprising a plurality of cells, a hard decode configured to read each cell of the plurality of cells at a hard decode voltage, a left read sense configured to read voltage values of each cell to the left of the hard decode voltage at a left read sense voltage, a right read sense configured to read voltage values of each cell to the right of the hard decode voltage at a right read sense voltage, and a first combiner configured to determine a difference of voltage values read by the left read sense and right read sense to produce a dispersion signal. The dispersion signal is operable to determine the distance between the left read sense voltage and right read sense voltage.

In another embodiment, a data storage device includes a controller, a non-volatile memory (NVM) device coupled to the controller, the NVM device comprising a plurality of wordlines, each comprising a plurality of cells, and a cell statistics generator (CSG) coupled to the NVM. The CSG comprises logic configured to cause the CSG to accumulate left error voltage values of each cell of the plurality of cells that are left of a hard decode voltage value within a left bin spacing, accumulate right error voltage values of each cell of the plurality of cells that are right of the hard decode voltage value within a right bin spacing, and combine accumulated left error voltage values and right error voltage values to generate a deviation value operable to position the left bin spacing and right bin spacing.

In another embodiment, a data storage device includes controller means and a non-volatile memory (NVM) means coupled to the controller means. The NVM means includes a plurality of wordline means, each comprising a plurality of cells, a hard decode voltage configured to read each cell of the plurality of cells, and a cell statistics generator (CSG) coupled to the NVM means and the controller. The CSG includes a left read sense means configured to read voltage values of each cell to the left of the hard decode voltage at a left read sense voltage, a right read sense means configured to read voltage values of each cell to the right of the hard decode voltage at a right read sense voltage, and a deviation combiner means configured to determine a summation of voltage values read by the left read sense and right read sense to produce a deviation signal. The deviation signal is operable to determine that a center between the left read sense voltage and right read sense voltage will shift. Where the deviation signal indicates a shift is needed to adjust the left and right read sense voltages, the left, right, and hard read values all shift together.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to error detection in a non-volatile memory (NVM) device, and more particularly, to setting voltage read levels in an NVM device. A non-volatile memory device includes a plurality of wordlines, each comprising a plurality of cells, a hard decode configured to read each cell of the plurality of cells at a hard decode voltage, a left read sense configured to read voltage values of each cell to the left of the hard decode voltage at a left read sense voltage, a right read sense configured to read voltage values of each cell to the right of the hard decode voltage at a right read sense voltage, a first combiner configured to determine a difference of voltage values read by the left read sense and right read sense to produce a dispersion signal, and a second combiner configured to determine a sum of the voltage values read by the left read sense and right read sense to produce a deviation signal.

Figure 1:
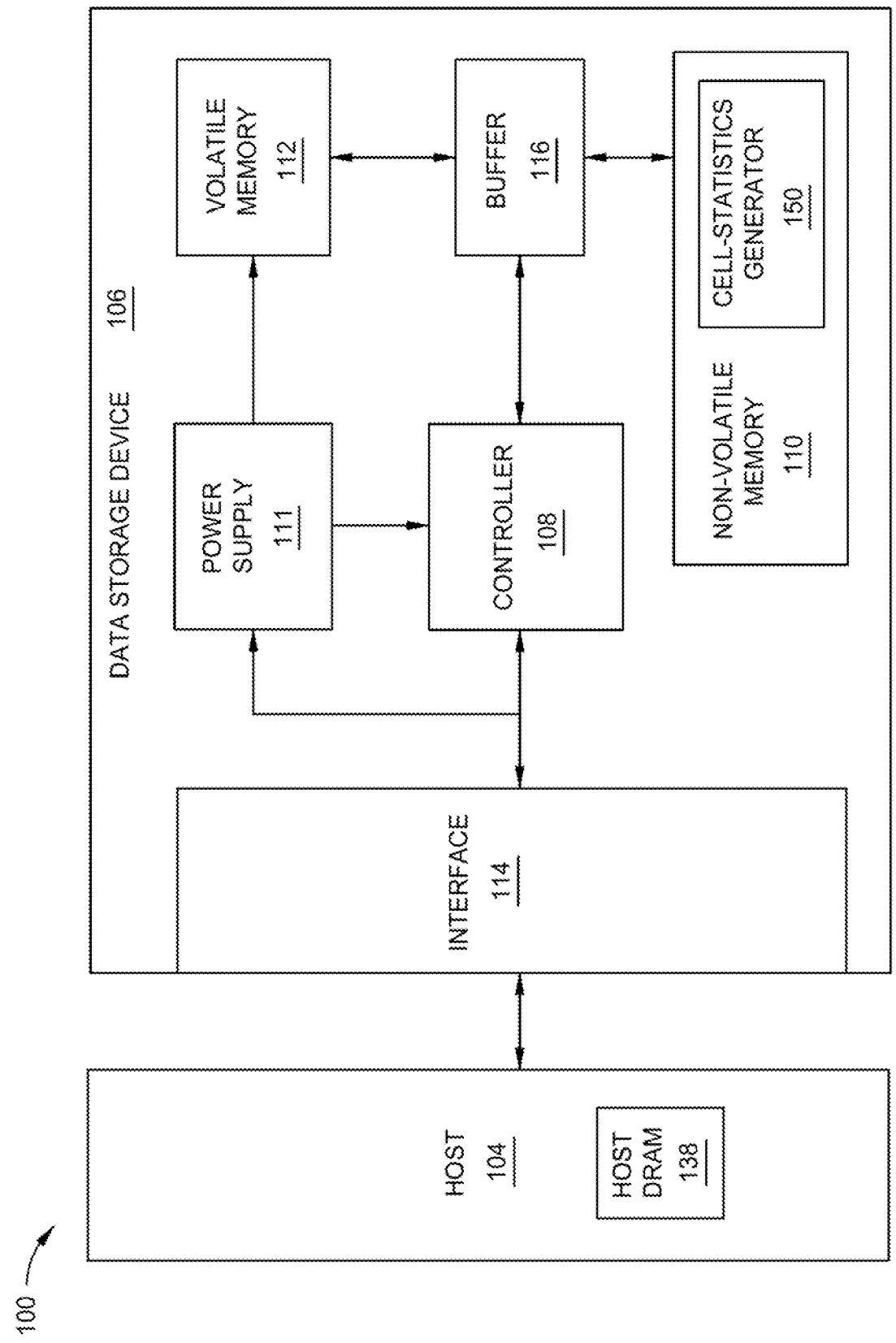
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe ×1, ×4, ×8, ×16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices. The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The NVM 110 includes a cell statistics generator (CSG) 150. The CSG 150 is embedded in the NVM 110 in order to add arithmetic addition elements to the NVM 110. For example, the CSG 150 may be embedded in each NVM die of the NVM 110. The CSG 150 may assist with the optimization and the tuning of each NVM die. For example, the CSG 150 may allow parallel processing of dies in order for more efficient recovery and operations of the data storage device 106. In other embodiments, the CSG 150 may be implemented in the controller 108.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
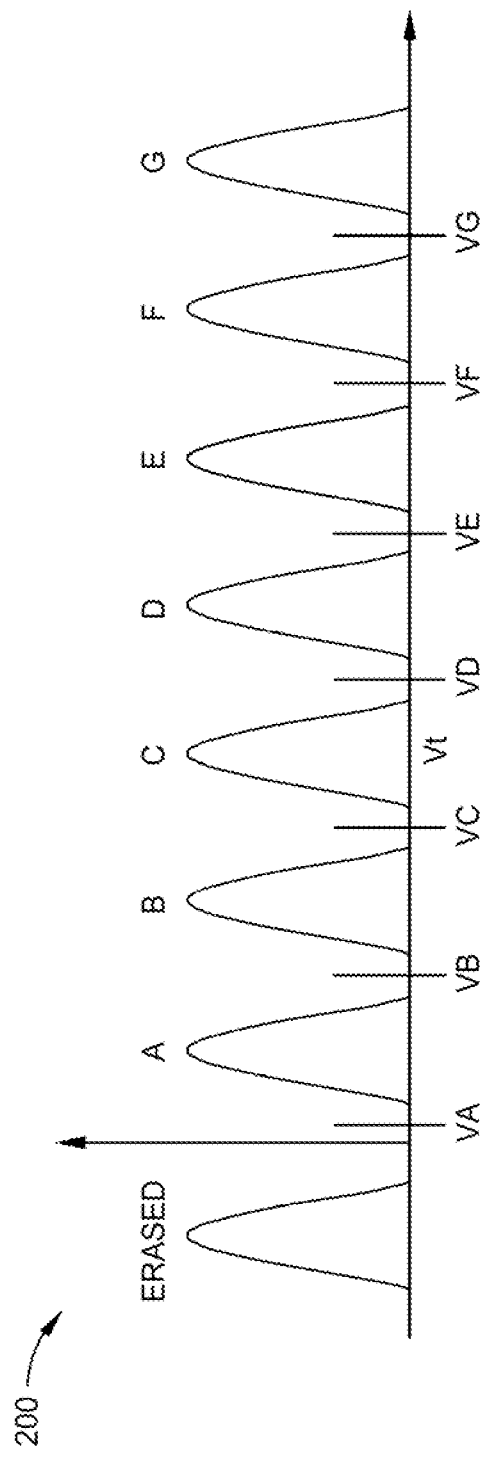
FIG. 2A is a graph illustrating threshold voltages for TLC memory, according to certain embodiments.

FIG. 2A is a graph 200 illustrating threshold voltages for TLC memory, according to certain embodiments. TLC memory includes 3 bits, where each bit may have a program state of either 0 or 1. The program state refers to the state of the memory cell, whether the memory cell is empty (i.e., no data exists) or the memory cell is programmed (i.e., data exists). Furthermore, the number of unique combinations of program states can be solved in the following equation: (Total number of voltage levels)=2^(number of bits per memory cell). For the TLC memory, the number of voltage levels is eight because 2"^3=8.

As the number of bits of the memory cell increases, the memory cell can record more information leading to larger data storage. Furthermore, the equation for the unique combination of program states may be applied to SLC memory, TLC memory, QLC memory, penta-layer cell (PLC) memory, and other higher iterations of layer cell memory.

The program state of 0 refers to a programmed state, whereas the program state of 1 refers to an erased state. The TLC memory has 8 voltage levels, where one is erased and seven are programmed. Furthermore, the one voltage level that is erased has a bit combination of program state 111. For any memory cell, if the bit combination only contains the program state 1, then the program state is erased (e.g., 1 for SLC, 11 for MLC, and 1111 for QLC). Listing from lowest threshold voltage, denoted by Vt on the x-axis, to highest threshold voltage in FIG. 2A, the voltage levels are 111 for the erased cell state, 110 for cell state A, 100 for cell state B, 000 for cell state C, 010 for cell state D, 011 for cell state E, 001 for cell state F, and 101 for cell state G.

The bits for the cell state (i.e., ###) are upper page, middle page, lower page. Furthermore, the lines between the curves are labeled VA, VB, VC, VD, VE, VF, and VG are related to the threshold or reference voltage. For other memory cells, the number of threshold or reference voltages can be solved by the following equation: (number of threshold or reference voltages)=(total number of voltage levels)−1. The individual pages of data can be read by performing a number of comparisons at one or more threshold points and determining whether the cell voltage is lower or higher than the threshold.

Figure 2B:
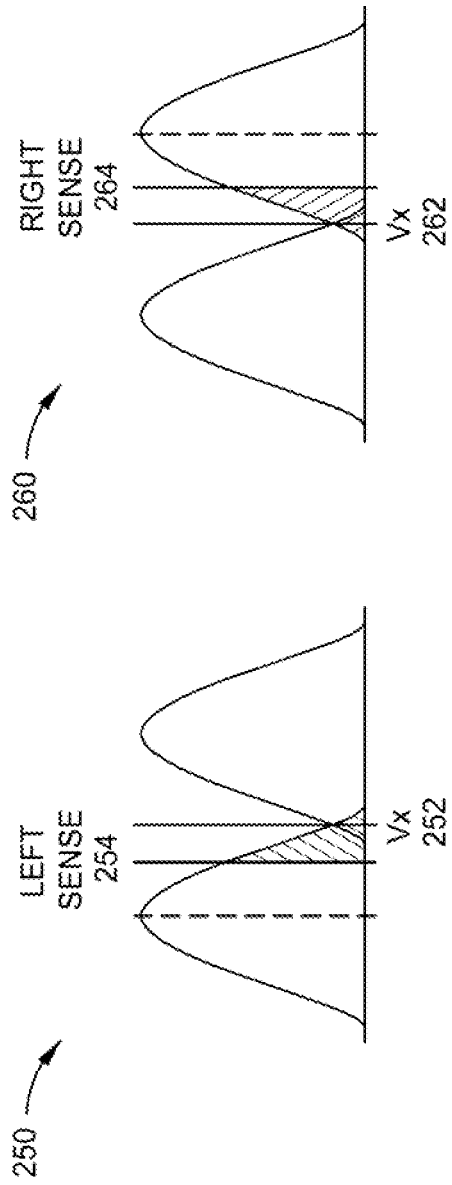
FIG. 2B are graphs illustrating a left sense and a right sense, according to certain embodiments.

FIG. 2B are graphs 250, 260 illustrating a left sense 254 and a right sense 264, according to certain embodiments. Vx 252, 262 are thresholds or reference voltages (i.e., a hard decode threshold), such as VA, VB, VC, VD, VE, VF, and VG of FIG. 2A. In the example described herein, Vx 252, 262 may be VD of FIG. 2A, such that cell state C is to the left of Vx 252, 262 and cell state D is to the right of Vx 252, 262. For simplification purposes herein, Vx 252 and Vx 262 are equal voltage values. However, in some embodiments Vx 252 and Vx 262 are different voltage values, such as when either or both Vx 252 and Vx 262 are adjusted by a calculated deviation value (described below). When executing a sense at the threshold or reference voltage, the sense may be split into the left sense 254 (shown in graph 250) and the right sense 264 (shown in graph 260).

Likewise, the left sense 254 and the right sense 264 may be executed and read by a hard decode, such as a sense amplifier. The left sense 254 and the right sense 264 are iteratively executed (i.e., the error area is calculated) up to a 0.25 threshold offset (i.e., quarter bin spacing) from the mean voltage of the relevant cell state indicated by a dashed line. For example, the left sense 254 may be completed one or more times at a left read sense voltage, where the left read sense voltage moves further from the threshold or reference voltage at each increasing iteration. The left sense 254 and the right sense 264 may output an error or an error rate for the respective sense (e.g., the left sense 254 is used to determine the error or error rate for the cell state to the left of Vx 252).

The 0.25 threshold offset may be determined by a Q-function (e.g., $Q(x,\mu,\sigma)$), where the Q-function equals 0.5 for any sigma. The sensing between two Gaussian distributions spaced one bin apart and with a common sigma may be represented as: $\text{Sense}(x,\sigma)=[1-Q(x,0.5, \sigma)]-Q(x,-0.5,\sigma)$. Therefore, using sense offsets of 0.25 (i.e., quarter bin spacing) leads to the end points of the transfer function being fixed and the transfer function slope, independent of the sigma, substantially equal to about 2. By executing the left sense 254 and the right sense 264 and the 0.25 threshold offset, the error (i.e., the threshold overlap between the cell state) of the adjacent relevant cell state is effectively 0. For example, the left sense 254 may cause the error of the cell state to the right of the Vx 252 to effectively be 0. In the description herein, reference to a left sense and a right sense refers to an error voltage value determined by the respective sense (e.g., the left sense 254 or the right sense 264).

A dispersion output or signal may be the difference of the right sense 264 and the left sense 254. The dispersion output or signal may be calculated as: $\text{Dispersion}=\text{Sense}(x+0.25, \sigma)-\text{Sense}(x-0.25,\sigma)$. A deviation output or signal may be the sum of the right sense 264 and the left sense 254. The deviation output or signal may be calculated as: $\text{Deviation}=\text{Sense}(x+0.25, \sigma)+\text{Sense}(x-0.25,\sigma)$.

Figure 3:
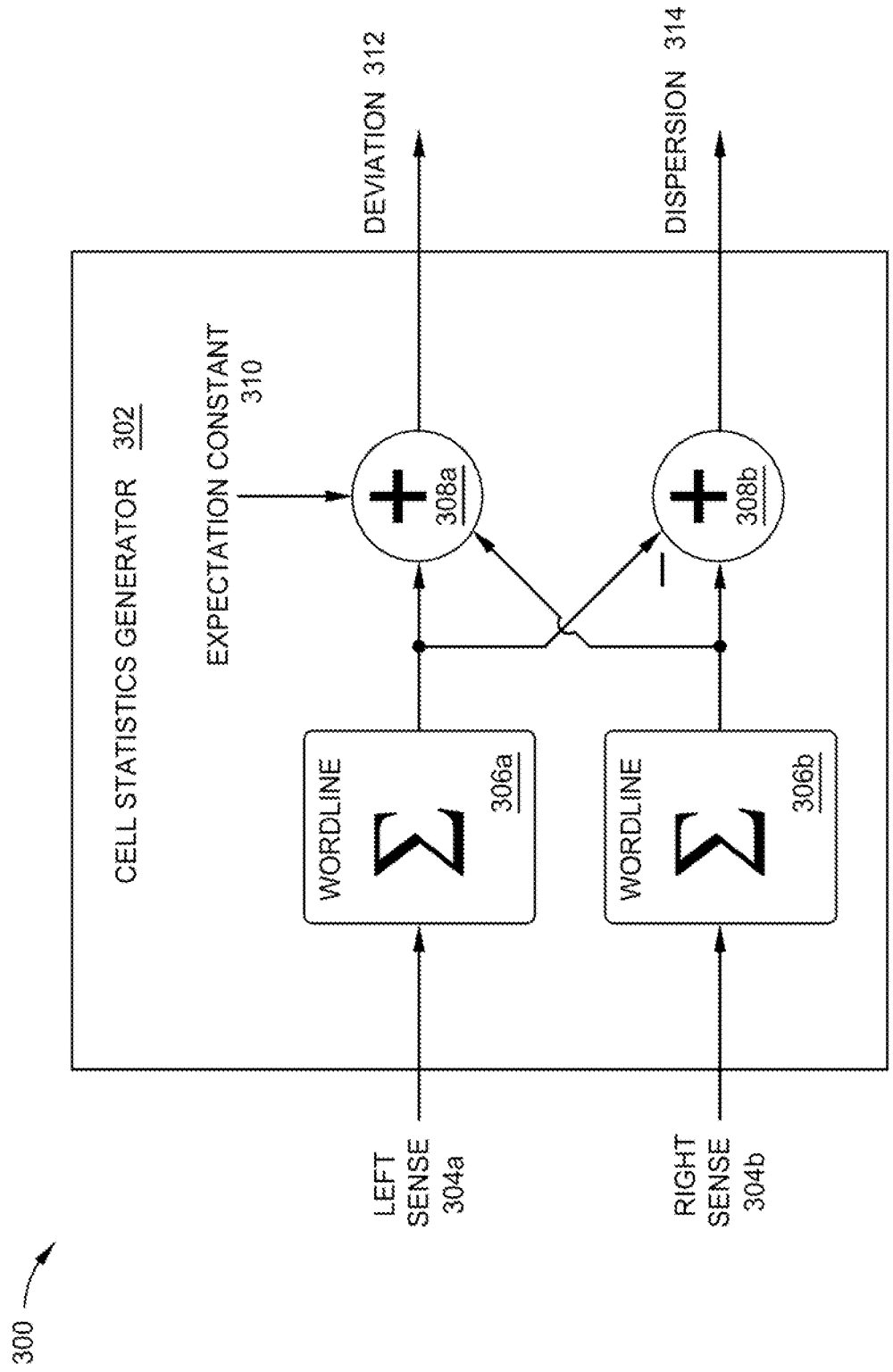
FIG. 3 is a schematic block diagram illustrating a cell statistics generator, according to certain embodiments.

FIG. 3 is a schematic block diagram 300 illustrating a CSG 302, according to certain embodiments. The CSG 302 may be the CSG 150 of FIG. 1. The CSG 302 receives a left sense 304a and a right sense 304b for a wordline of an NVM, such as the NVM 110 of FIG. 1. The left sense 304a may be the left sense 254, and the right sense 304b may be the right sense 264 of FIG. 2B. Because the left sense 304a and the right sense 304b are iterative senses, the plurality of left senses are accumulated at a first adder 306a for cells of a wordline of the NVM 110, and the plurality of right senses are accumulated at a second adder 306b for the same cells of the wordline of the NVM 110.

The accumulated left senses and the accumulated right senses are combined in a first combiner 308a operating in an additive mode with an expectation constant 310 (i.e., accumulated senses plus the expectation constant 310) to calculate a deviation output 312 and a second combiner 308b operating in a subtractive mode (i.e., accumulated senses minus the expectation constant 310) with the expectation constant 310 to calculate a dispersion output 314. The expectation constant 310 is a constant representing the expected accumulation value if the left and right read senses were optimal and distributions very narrow. By way of example, let N=total number of bins=$2^{\text{bits\_per\_cell}}$. Let I=Threshold index tested=1 to (N−1). By way of example a TLC has $2^3$ bins and 8−1=7 thresholds. For this example the expectation constant 310 would be equal to (i/N)*2*wordline_length. A wordline_length in this context may be 16 kBytes per page (16384*8=131072 cells per wordline). The deviation output 312 is a zero-based linear error metric for shifting read sense voltage parameters to voltage levels optimal for minimizing errors of cells of a wordline, and the dispersion output 314 represents an error count metric at a compressed bin spacing and is operable to determine the distance between the left read sense voltage and right read sense voltage. For example, adapting the threshold voltage shift parameters may include shifting the threshold voltage by an offset, such that the threshold voltage is substantially even in distance (e.g., voltage difference) from the adjacent cell states. The compressed bin spacing may be based on the relevant threshold offset (e.g., the 0.25 threshold offset).

Figure 4:
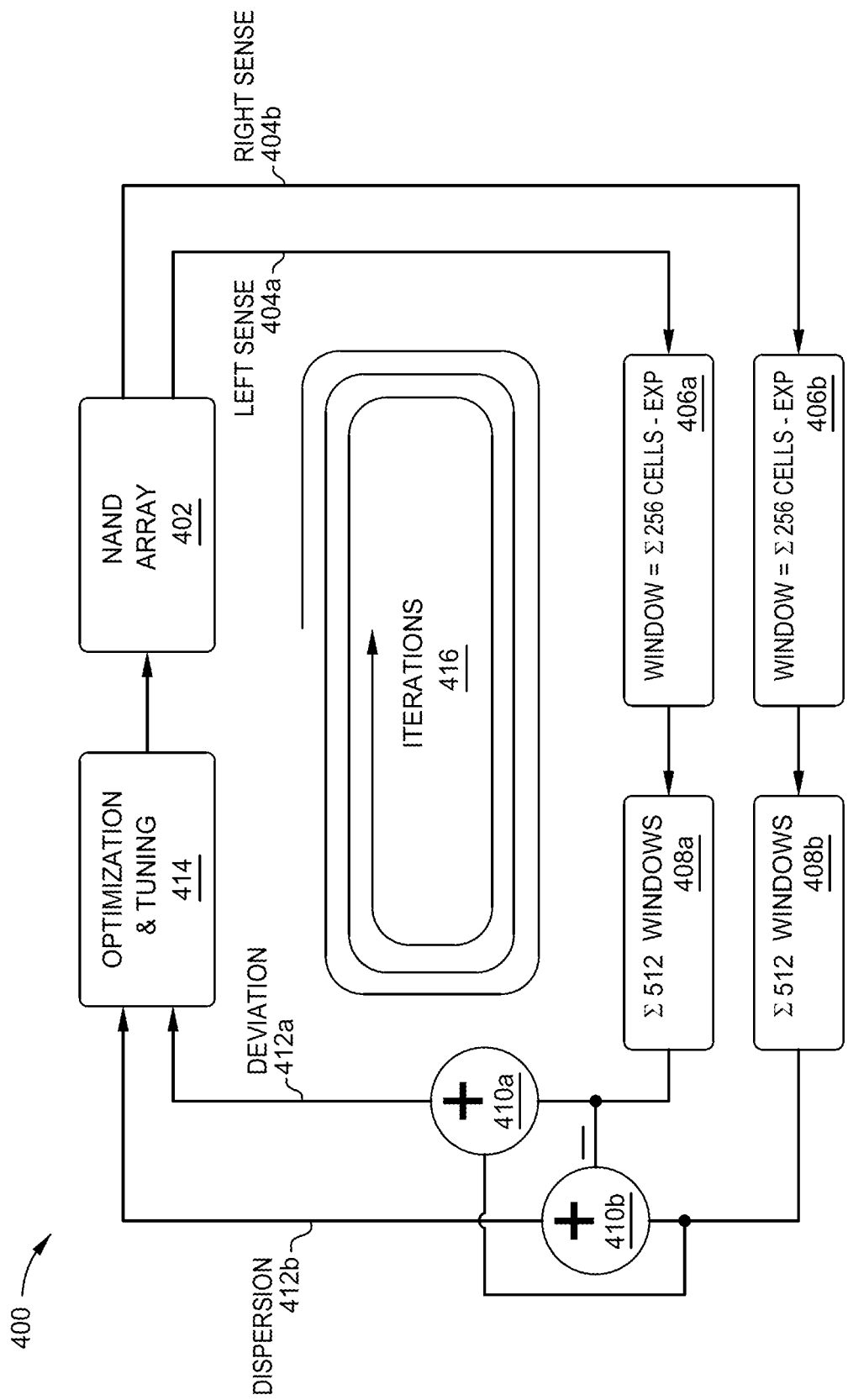
FIG. 4 is a flow diagram illustrating the operation of a cell statistics generator, according to certain embodiments.

FIG. 4 is a flow diagram 400 illustrating the operation of a CSG, such as the CSG 302 of FIG. 3, according to certain embodiments. A left sense 404a and a right sense 404b are executed on a wordline to determine a relevant threshold voltage of a NAND array 402 (e.g., sensing a cell state of the wordline). Although shown as both a left sense 404a and a right sense 404b, the senses may be decoupled, such that each sense is completed independently of each other and the accumulated sense is stored in a table to be used after both the left sense 404a and the right sense 404b have been completed. It is to be understood that in the description herein, a left read sense produces a negative result and a right read sense produces a positive result, where the results of the left read sense and the right read sense are calculated relative to the threshold voltage. A first adder 406a sums the left sense 404a for each of the cells of a wordline (e.g., 256 cells) and subtracts an expectation constant, such as the expectation constant 310 of FIG. 3, from the summation result. Likewise, a second adder 406b sums the right sense 404b for each of the cells and subtracts the expectation constant from the summation result. In the context of FIG. 4, the expectation constant is (i/N)*256 for each of 406a and 406b, according to certain embodiments.

After the first adder 406a and the second adder 406b adds the respective senses (i.e., the left sense 404a and the right sense 404b), each of the windows resulting from the first adder 406a and the second adder 406b are summed (e.g., the sum of 512 windows) at a respective third adder 408a and a respective fourth adder 408b. The results of the third adder 408a and the fourth adder 408b are combined at a first combiner 410a and at a second combiner 410b.

The first combiner 410a operates in an additive mode to calculate a deviation output 412a. The additive mode utilizes signed values (i.e., includes both negative and positive integers). In some embodiments, the first combiner 410a adds the accumulated left read sense values of the fourth adder 408b to the accumulated right read sense values of the third adder 408a to obtain a signed value. Based on the resulting value of the first combiner 410a, the left read sense and right read sense are shifted together to the left (negative voltage direction) or to the right (positive voltage direction) as a pair. For example, if the deviation output 412a is negative, indicating an error in the negative direction, then the voltage of the left sense and the right sense are shifted in the positive voltage direction in order to reduce the error. If the deviation output 412a is positive, indicating an error in the positive direction, then the voltage of the left sense and the right sense are shifted in the negative voltage direction in order to reduce the error.

The second combiner 410b operates in a subtractive mode to calculate a dispersion output 412b, representing a total number of errors at a compressed bin spacing, by changing the sign of, and subtracting the accumulated left read sense values of the fourth adder 408b from the accumulated right read sense values of the third adder 408a to obtain a positive value. This positive value is used to determine the distance between the left read sense and right read sense. A target value T of total number of errors may be set to 10%, according to certain embodiments, of the total senses accumulated (e.g., 2*Wordline_Length) The subtractive mode utilizes unsigned values (i.e., includes only positive integers). The dispersion output 412b describes a bin adjustment of the left sense and the right sense. The bin may be described as a percentage of a voltage curve for the respective cell state that the left read sense or the right read sense is executed at. For example, if the dispersion output 412b is less than the desired T target value, indicating a distance between left and right senses being too small, the left sense is moved further left while the right sense is moved further right in order to increase the distance between left and right senses. If the dispersion output 412b is greater than the desired 'T' target value, indicating a distance between left and right senses being too large, the left sense is moved toward the right while the right sense is moved toward the left in order to decrease the distance between left and right senses.

The deviation output 412a and the dispersion output 412b are provided to an optimization and tuning unit 414. The optimization and tuning unit 414 is configured to adjust the right and left sense voltages as well as adjust the compressed bin spacing of the relevant area for cells in a wordline. For example, the deviation output 412a is utilized to adjust the left and/or right read sense voltage, and the dispersion output 412b is used to adjust the compressed bin spacing (i.e., adjust the bin spacing of the cell state to the left of the threshold and the bin spacing of the cell state to the right of the threshold). The optimization and tuning of the NAND array 402 may require one or more iterations 416, such as three iterations, to achieve read threshold values that are optimized and tuned.

Figure 5:
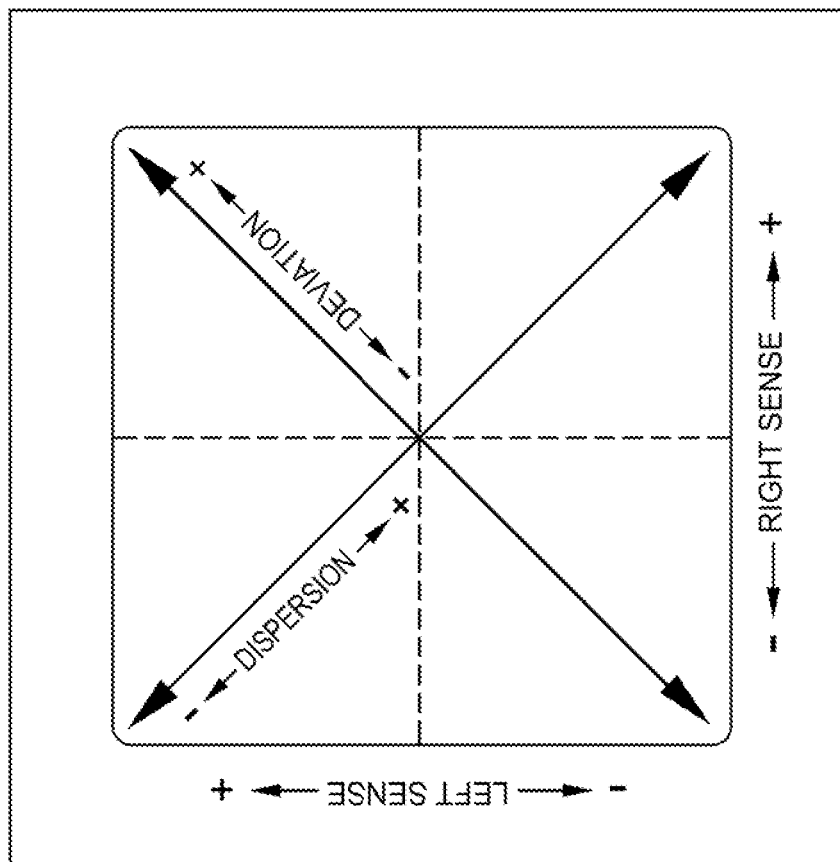
FIG. 5 is a graph illustrating dispersion-deviation based on a left sense and a right sense, according to certain embodiments.

FIG. 5 is a graph 500 illustrating dispersion-deviation based on a left sense and a right sense, according to certain embodiments. The right sense is the x-axis, and the left sense is the y-axis. In the context of FIG. 5, the plus sign and negative sign indicate higher, or lower, relative voltages, that may not be positive and negative values in certain embodiments. In the depicted graph 500 where the left read sense is too high and right read sense is too high, the Deviation output is positive (larger). Where the left read sense is too low and right read sense is too low then Deviation output is negative (smaller). Where the left read sense is too high and right read sense is too low then Dispersion output is smaller (−). Where the left read sense is too low and right sense is too high then Dispersion output is larger (+).

The deviation output is a zero-based linear error metric for adapting parameters. The dispersion output represents an error count metric at a compressed bin spacing. The deviation output and the dispersion output are substantially orthogonal to each other, in that adjusting one of the deviation output or the dispersion output has little effect on the other, according to certain embodiments.

Figure 6:
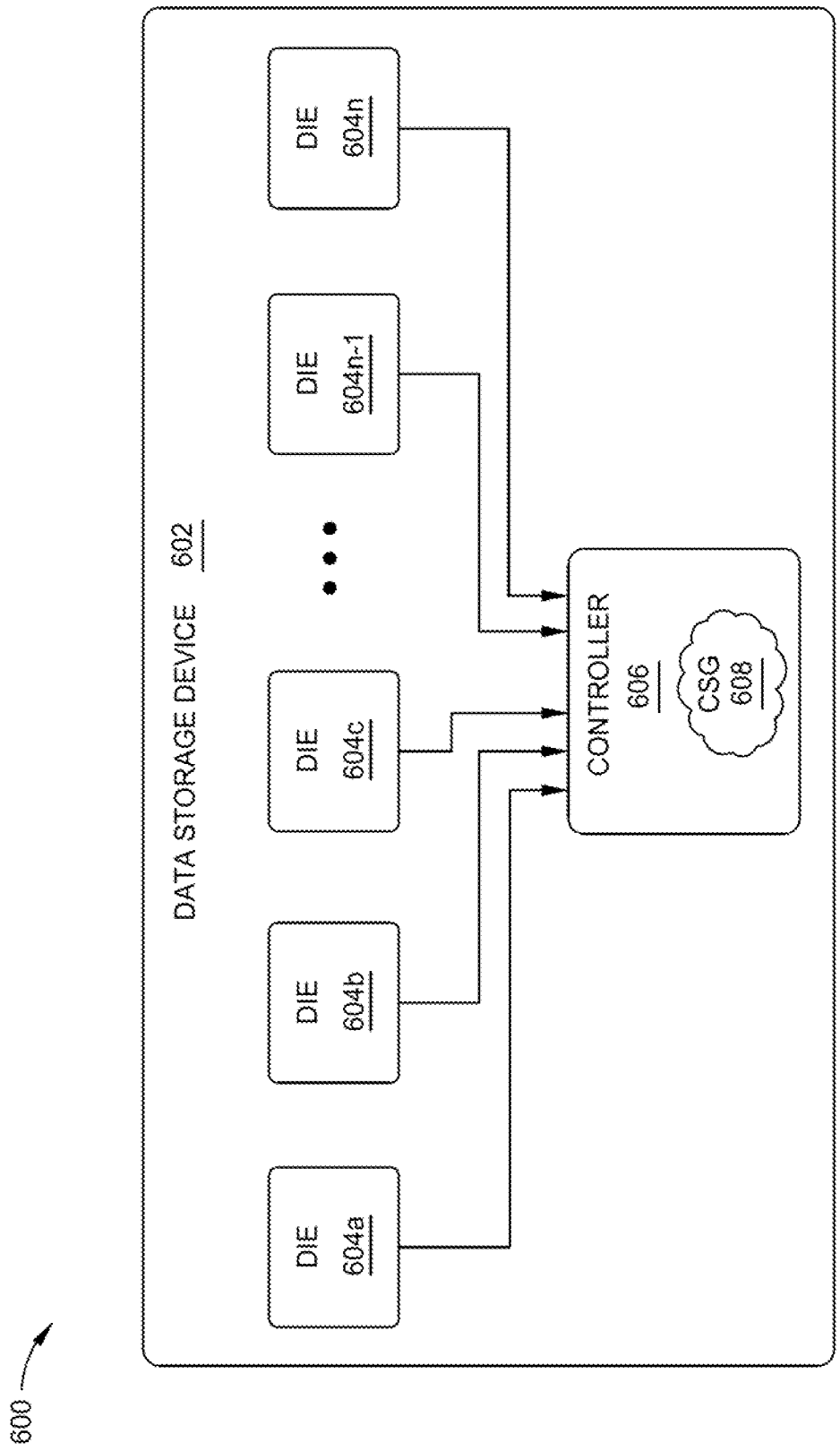
FIG. 6 is a schematic block diagram illustrating a data storage device operating with a controller-based cell statistics generator, according to certain embodiments.

FIG. 6 is a schematic block diagram 600 illustrating a data storage device 602 operating with a controller-based CSG 608, which may be the CSG 302 of FIG. 3, according to certain embodiments. The data storage device 602 includes a plurality of dies 604a-604n as part of an NVM, such as the NVM 110 of FIG. 1. Each of the plurality of dies 604a-604n are coupled to a controller 606. The controller 606 may be the controller 108 of FIG. 1. In some examples, the controller 606 may be CMOS bounded array (CbA), CMOS under array (CUA), or CMOS above the array (CAA). The controller 606 includes a CSG 608, where the CSG 608 may execute the processes (e.g., left sense, right sense, summing the windows, calculating the deviation and dispersion, and optimizing and tuning the threshold voltage of the one or more dies) described in the operation of a CSG of FIG. 4. In other examples, each of the plurality of dies 604a-604n are coupled to a CbA, a CUA, or a CAA, such that each die of the plurality of dies has a CMOS chip architecture coupled to the die. Furthermore, the CMOS chip architecture may include the CSG 608.

Figure 7:
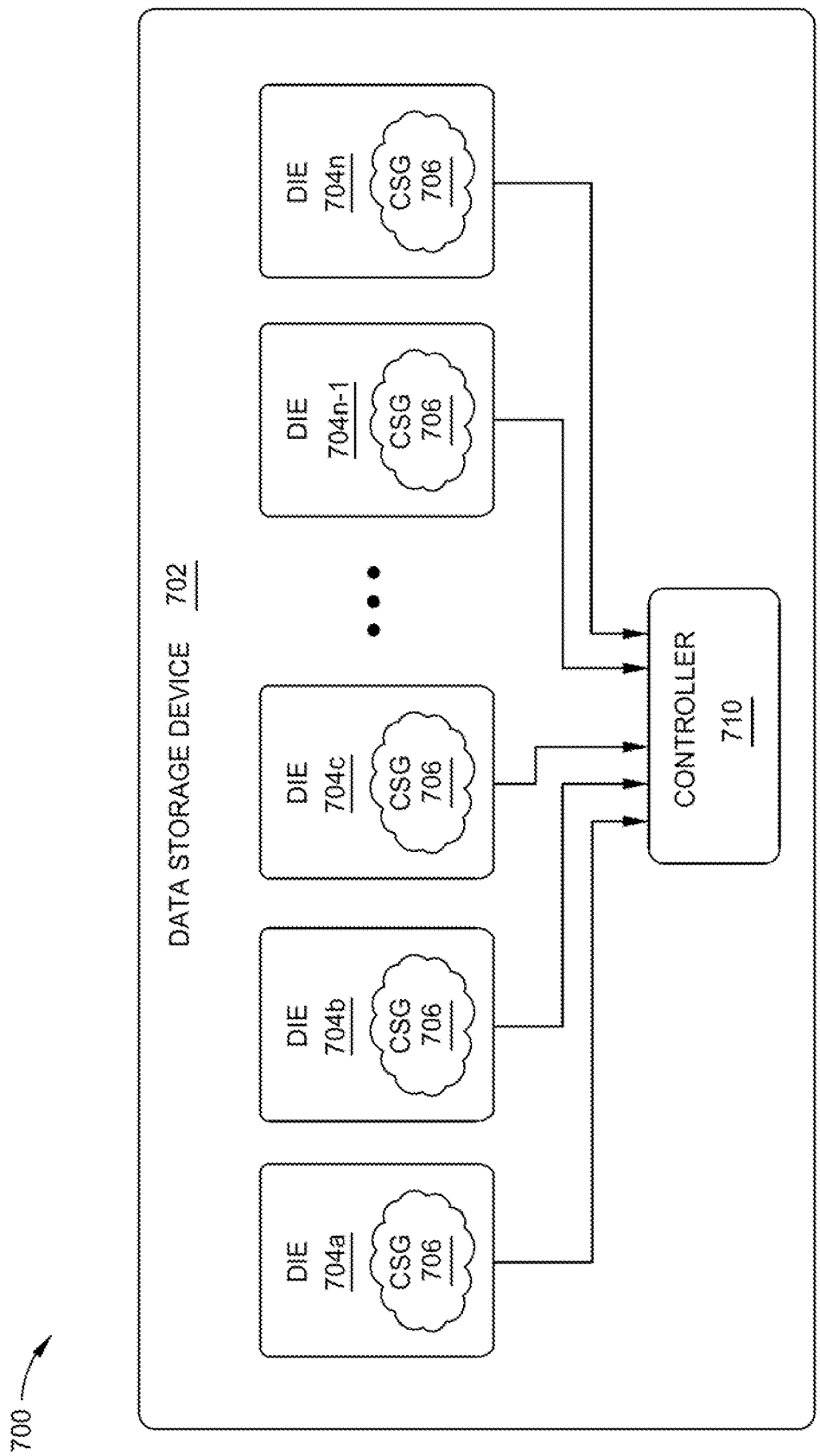
FIG. 7 is a schematic block diagram illustrating a data storage device operating with a plurality of die-based cell statistics generators, according to certain embodiments.

FIG. 7 is a schematic block diagram 700 illustrating a data storage device 702 operating with a plurality of die-based CSGs 706, which may each be the CSG 302 of FIG. 3, according to certain embodiments. The data storage device 702 includes a plurality of dies 704a-704n as part of an NVM, such as the NVM 110 of FIG. 1. Each of the plurality of dies 704a-704n are coupled to a controller 710. The controller 710 may be the controller 108 of FIG. 1. In some examples, the controller 710 may be CMOS bounded array (CbA), CMOS under array (CUA), or CMOS above the array (CAA). In other examples, each of the plurality of dies 704a-704n are coupled to a CbA, a CUA, or a CAA, such that each die of the plurality of dies has a CMOS chip architecture coupled to the die. Furthermore, the CMOS chip architecture may include the CSG 706.

Each of the plurality of dies 704a-704n includes a CSG 706, where the CSG 706 may execute the processes (e.g., left sense, right sense, summing the cells and the windows, calculating the deviation and dispersion, and optimizing and tuning the threshold voltage of the one or more dies) described in the operation of a CSG of FIG. 4. Furthermore, each CSG 706 may be executed in parallel, such that the plurality of dies 704a-704n are optimized and tuned in parallel.

Figure 8:
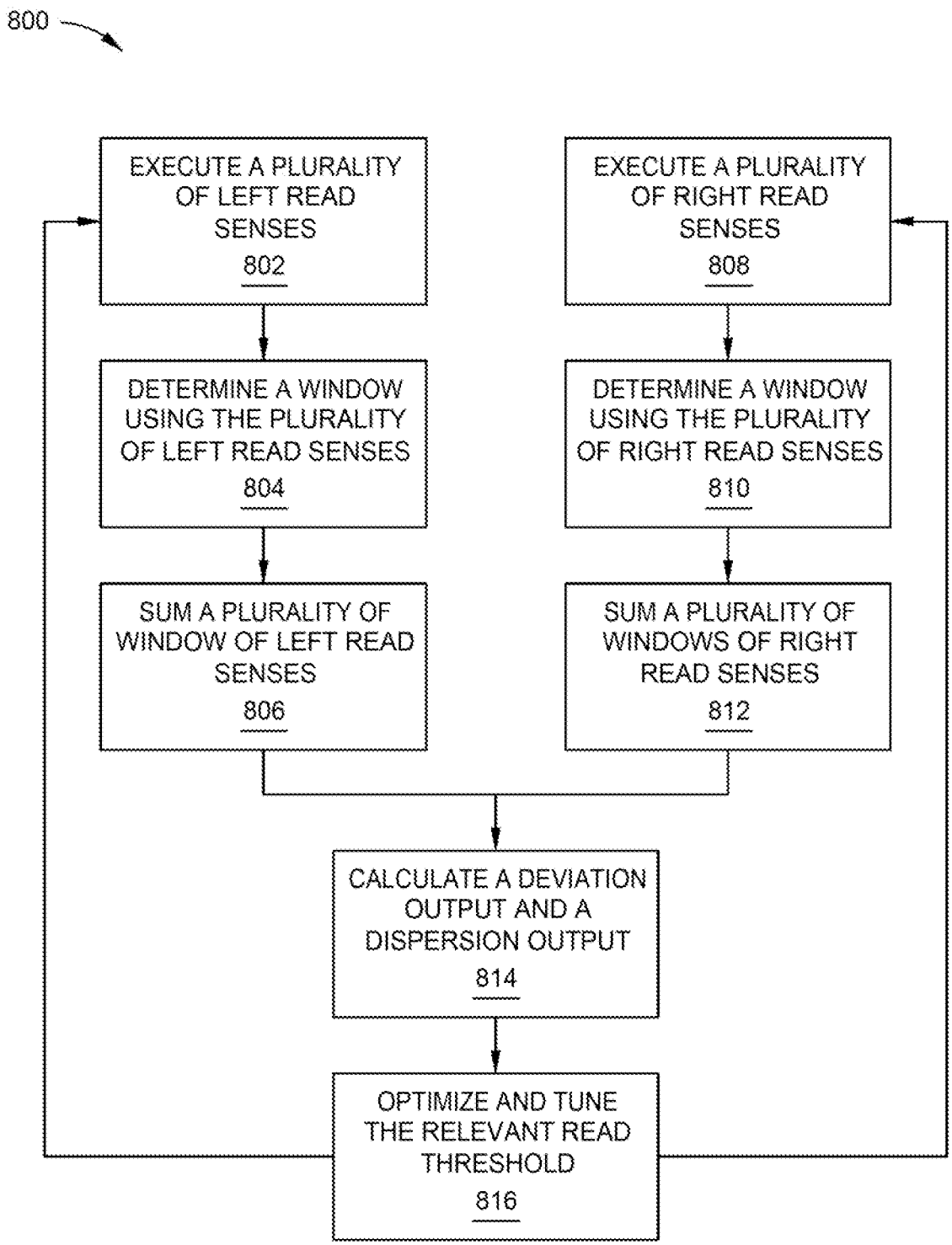
FIG. 8 is a flow diagram illustrating a method of optimizing and tuning read thresholds, according to certain embodiments.

FIG. 8 is a flow diagram illustrating a method 800 of optimizing and tuning read thresholds, according to certain embodiments. Method 800 may be implemented and executed by a CSG, such as the CSG 302 of FIG. 3. It is to be understood that blocks 802, 804, and 806 may be completed in parallel with or independently of blocks 808, 810, and 812.

At block 802, a controller, such as the controller 108 of FIG. 1, executes a plurality of left read senses at a determined threshold voltage (e.g., Vx 252, 262 of FIG. 2B), where the CSG 302 receives the plurality of left read senses. At block 804, the CSG 302 determines one or more first windows by summing the plurality of left read senses and subtracting an expected constant value from the summation result at a first adder, such as the first adder 406a of FIG. 4. At block 806, the CSG 302 sums the one or more first windows of the left read senses at a second adder, such as the third adder 408a of FIG. 4.

At block 808, the controller 108 executes a plurality of right read senses at a determined threshold voltage (e.g., Vx 252, 262 of FIG. 2B), where the CSG 302 receives the plurality of right read senses. At block 810, the CSG 302 determines one or more second windows by summing the plurality of right read senses and subtracting an expected constant value from the summation result at a third adder, such as the second adder 406b of FIG. 4. At block 812, the CSG 302 sums the one or more second windows of the right read senses at a fourth adder, such as the fourth adder 408b of FIG. 4.

After calculating both summed windows (i.e., summed first windows and summed second windows) at blocks 806 and 812, the CSG 302 calculates a deviation output and a dispersion output using both the summed windows at block 814. The deviation output may be calculated by calculating the sum of the summed first windows and the summed second windows. The dispersion output may be calculated by calculating the difference between the summed first windows and the summed second windows. At block 816, the CSG 302 utilizes an optimization and tuning unit, such as the optimization and tuning unit 414 of FIG. 4, to adjust the relevant threshold voltages. Method 800 may iterate one or more times until the optimization and tuning of the relevant threshold voltages is determined to be sufficient or above a threshold value. By way example, according to certain embodiments, the sense adjustment is in steps of $\frac{1}{32}$ of a nominal bin width. An acceptable criteria for convergence might be that the total adjustment being made to each the left and right senses is less than 1 step representing $\frac{1}{32}$ of a nominal bin width. For example, method 800 may iterate three times.

By including a cell statistics generator coupled to the NVM, dispersion and deviation of the threshold or reference voltages may be calculated and utilized to optimize and tune the relevant threshold or reference voltages. Furthermore, the calculated dispersion and deviation metrics may be used for achieving optimal threshold or reference voltage values, enhancing soft decoding capability, and reducing test time in mapping bad blocks of the NVM.

In one embodiment, a non-volatile memory (NVM) device includes a plurality of wordlines, each comprising a plurality of cells, a hard decode configured to read each cell of the plurality of cells at a hard decode voltage, a left read sense configured to read voltage values of each cell to the left of the hard decode voltage at a left read sense voltage, a right read sense configured to read voltage values of each cell to the right of the hard decode voltage at a right read sense voltage, and a first combiner configured to determine a difference of voltage values read by the left read sense and right read sense to produce a dispersion signal. The dispersion signal is operable to move at least one of the left read sense voltage or right read sense voltage relative to the hard decode voltage.

The NVM device further includes a left sense accumulator coupled to the first combiner that accumulates voltage values read by the left read sense and a right sense accumulator coupled to the first combiner that accumulates voltage values read by the right read sense. The left sense accumulator receives voltage values read by the left read sense, and the right sense accumulator receives voltage values read by the right read sense. The NVM device further includes a second combiner configured to determine a sum of the voltage values read by the left read sense and right read sense to produce a deviation signal. The deviation signal is operable to shift the positions of the left read sense voltage and right read sense voltage. A relative distance between the left read sense voltage and right read sense voltage is maintained. The second combiner further includes an expectation constant input. The second combiner is configured to subtract a value provided by the expectation constant input from the sum of the voltage values. The first combiner includes an adder. The second combiner includes an adder. The left read sense voltage and right read sense voltage is within one-quarter of a bin spacing from the hard decode voltage.

In another embodiment, the data storage device includes a controller, a non-volatile memory (NVM) device coupled to the controller, the NVM device comprising a plurality of wordlines, each comprising a plurality of cells, and a cell statistics generator (CSG) coupled to the NVM. The CSG comprises logic configured to cause the CSG to accumulate left error voltage values of each cell of the plurality of cells that are left of a hard decode voltage value within a left bin spacing, accumulate right error voltage values of each cell of the plurality of cells that are right of the hard decode voltage value within a right bin spacing, and combine accumulated left error voltage values and right error voltage values to generate a deviation value operable to position the left bin spacing and right bin spacing.

The deviation value is operable to position the left bin spacing relative to the right bin spacing. The logic is further configured to subtract an expectation value from the deviation value. The logic is configured to cause the CSG to combine the left error voltage values and right error voltage values comprise adding the left error voltage values and right error voltage values. The logic further configured to cause the CSG to generate a difference between the left error voltage values and right error voltage values to generate a dispersion value operable to change one of the left bin spacing and right bin spacing. The logic further configured to cause the CSG to comprise a hard decode voltage value, wherein the left bin spacing and right bin spacing are each less than or equal to a bin value based on the hard decode voltage. The dispersion value is operable to change one of the left bin spacing and right bin spacing relative to the hard decode voltage value.

In another embodiment, a data storage device includes controller means and a non-volatile memory (NVM) means coupled to the controller means. The NVM means includes a plurality of wordline means, each comprising a plurality of cells, a hard decode voltage configured to read each cell of the plurality of cells, and a cell statistics generator (CSG) coupled to the NVM means and the controller. The CSG includes a left read sense means configured to read voltage values of each cell to the left of the hard decode voltage at a left read sense voltage, a right read sense means configured to read voltage values of each cell to the right of the hard decode voltage at a right read sense voltage, and a deviation combiner means configured to determine a summation of voltage values read by the left read sense and right read sense to produce a deviation signal. The deviation signal is operable to determine a distance between the left read sense voltage and right read sense voltage relative to the hard decode voltage.

The data storage device further includes a left sense accumulator means coupled to the deviation combiner means, that accumulates voltage values read by the left read sense means, and a right sense accumulator means coupled to the deviation combiner means, that accumulates voltage values read by the right read sense means. The data storage device further includes a dispersion combiner means configured to determine a difference of the voltage values read by the left read sense means and right read sense means to produce a deviation signal. The dispersion signal is operable to shift the left read sense voltage and right read sense voltage relative to the hard decode voltage. A relative distance between the left read sense voltage and right read sense voltage is maintained. The deviation combiner further includes an expectation constant input. The deviation combiner is configured to subtract a value provided by the expectation constant input from the summation of voltage values. The deviation combiner includes an adder. The left read sense voltage and right read sense voltage is within a quarter of a bin spacing from the hard decode voltage.

While the foregoing is directed to embodiments of the present disclosure, other and further embodiments of the disclosure may be devised without departing from the basic scope thereof, and the scope thereof is determined by the claims that follow.

What is claimed is:

1. A non-volatile memory (NVM) device, comprising:
a plurality of wordlines, each comprising a plurality of cells;
a hard decode configured to read each cell of the plurality of cells at a hard decode voltage;
a left read sense configured to read voltage values of each cell to the left of the hard decode voltage at a left read sense voltage;
a right read sense configured to read voltage values of each cell to the right of the hard decode voltage at a right read sense voltage;
a first adder for accumulating a plurality of voltage values of cells to the left of the hard decode voltage;
a second adder for accumulating a plurality of voltage values of cells to the right of the hard decode voltage;
a first combiner operating in additive mode to add the plurality of voltage values of cells to the left of the hard decode voltage and the plurality of voltage values of cells to the right of the hard decode voltage with an expectation constant to calculate a deviation output, wherein based on a value of the deviation output, an optimizing and tuning unit is configured to shift the left read sense voltage and the right read sense voltage as a pair; and
a second combiner operating in a subtractive mode to add the plurality of voltage values of cells to the left of the hard decode voltage and the plurality of voltage values of cells to the right of the hard decode voltage and subtract the expectation constant to calculate a dispersion output, wherein the expectation constant is an expected accumulation value of the plurality of voltage values of cells to the left of the hard decode voltage and the plurality of voltage values of cells to the right of the hard decode voltage.

2. The NVM device of claim 1, wherein the first adder is a left sense accumulator coupled to the first combiner, that accumulates voltage values read by the left read sense, the left sense accumulator receiving voltage values read by the left read sense; and wherein the second adder is coupled to the first combiner, that accumulates voltage values read by the right read sense, and wherein the second adder is a right sense accumulator receiving voltage values read by the right read sense.

3. The NVM device of claim 2, wherein the deviation signal is operable to shift positions of the left read sense voltage and right read sense voltage.

4. The NVM device of claim 3, wherein a distance between the left read sense voltage and right read sense voltage is maintained.

5. The NVM device of claim 1, wherein the left read sense voltage and right read sense voltage is within one quarter of a bin spacing from the hard decode voltage.

6. A data storage device, comprising:
a controller;
a non-volatile memory (NVM) device coupled to the controller, the NVM device comprising a plurality of wordlines, each comprising a plurality of cells; and
a cell statistics generator (CSG) coupled to the NVM and comprising logic configured to cause the CSG to:
accumulate left error voltage values of each cell of the plurality of cells that are left of a hard decode voltage value within a left bin spacing;
accumulate right error voltage values of each cell of the plurality of cells that are right of the hard decode voltage value within a right bin spacing;
combine by a first combiner operating in additive mode to add accumulated left error voltage values and right error voltage values and an expectation constant to generate a deviation value operable to position the left bin spacing and right bin spacing, wherein based on a value of the deviation output, an optimizing and tuning unit is configured to shift the left error voltage values and the right error voltage values as a pair; and
calculate a dispersion output by a second combiner operating in subtractive mode to add the left error voltage values and the right error voltage values and subtract the expectation constant, wherein the expectation constant is an expected accumulation of left error voltages and the right error voltage.

7. The data storage device of claim 6, wherein the deviation value is operable to position the left bin spacing relative to the right bin spacing.

8. The data storage device of claim 6, the logic further configured to cause the CSG to comprise a hard decode voltage value, wherein the left bin spacing and right bin spacing are each less than or equal to a bin value based on the hard decode voltage.

9. The data storage device of claim 8, wherein the dispersion output is operable to change one of the left bin spacing and right bin spacing relative to the hard decode voltage value.

10. The data storage device of claim 6, wherein the CSG is disposed in the controller.

11. The data storage device of claim 6, wherein the CSG is disposed in the NVM device.

12. A data storage device, comprising:
a controller means; and
a non-volatile memory (NVM) means coupled to the controller means, comprising:
a plurality of wordline means, each comprising a plurality of cells;
a hard decode voltage configured to read each cell of the plurality of cells; and
a cell statistics generator (CSG) coupled to the NVM means and the controller, comprising:
a left read sense means configured to read voltage values of each cell to the left of the hard decode voltage at a left read sense voltage;
a right read sense means configured to read voltage values of each cell to the right of the hard decode voltage at a right read sense voltage;

a first adder means for accumulating a plurality of read values of cells to the left of the hard decode voltage;

a second adder means for accumulating a plurality of read values of cells to the right of the hard decode voltage;

a first combiner means operating in additive mode to add the plurality of read values of cells to the left of the hard decode voltage and the plurality of values of cells to the right of the hard decode voltage with an expectation constant to calculate a deviation output, wherein based on a value of the deviation output, an optimizing and tuning unit is configured to shift the left read sense voltage and the right read sense voltage as a pair; and a second combiner means operating in a subtractive mode to add the plurality of read values of cells to the left of the hard decode voltage and the plurality of read values of cells to the right of the hard decode voltage and subtract the expectation constant to calculate a dispersion output, wherein the expectation constant is an expected accumulation value of the plurality of values of cells to the left of the hard decode voltage and the plurality of values of cells to the right of the hard decode voltage.

13. The data storage device of claim 12, wherein the first adder means is coupled to the first combiner means, that accumulates voltage values read by the left read sense means; and wherein the second adder means is coupled to the second combiner means, that accumulates voltage values read by the right read sense means.

14. The data storage device of claim 13, wherein the dispersion output is operable to shift the left read sense voltage and right read sense voltage relative to the hard decode voltage, wherein a distance between the left read sense voltage and right read sense voltage is maintained.

15. The data storage device of claim 12, wherein the left read sense voltage and right read sense voltage is within a quarter of a bin spacing from the hard decode voltage.

16. The data storage device of claim 12, wherein the dispersion output represents an error count at a compressed bin spacing.

17. The data storage device of claim 16, wherein the deviation output and the dispersion output are orthogonal to each other.

18. The data storage device of claim 12, wherein the optimization and tuning unit adjusts relevant threshold voltages.

19. The data storage device of claim 18, wherein the CSG is further configured to iterate the optimization and tuning unit one or more times until the relevant threshold voltages are above a threshold value.

* * * * *